(12) United States Patent
Robb et al.

(10) Patent No.: US 7,537,970 B2
(45) Date of Patent: May 26, 2009

(54) BI-DIRECTIONAL TRANSISTOR WITH BY-PASS PATH AND METHOD THEREFOR

(75) Inventors: Francine Y. Robb, Fountain Hills, AZ (US); Stephen P. Robb, Fountain Hills, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 152 days.

(21) Appl. No.: 11/367,626

(22) Filed: Mar. 6, 2006

(65) Prior Publication Data

US 2007/0205431 A1 Sep. 6, 2007

(51) Int. Cl.
H01L 21/332 (2006.01)

(52) U.S. Cl. ............... 438/134; 438/135; 438/237; 257/E29.215

(58) Field of Classification Search ......... 438/133–135, 438/138–139, 141, 237, 275, 327; 257/E29.215
See application file for complete search history.

(56) References Cited

U.S. PATENT DOCUMENTS

| 4,847,522 | A | 7/1989 | Fuller et al. |
| 4,967,245 | A | 10/1990 | Cogan et al. |
| 5,877,527 | A | 3/1999 | Okabe et al. |
| 6,084,264 | A | 7/2000 | Darwish |
| 6,351,009 | B1 | 2/2002 | Kocon et al. |
| 6,624,469 | B1 | 9/2003 | Harada |
| 6,661,277 | B2 | 12/2003 | Dabral |
| 6,777,745 | B2 | 8/2004 | Hshieh et al. |
| 6,916,712 | B2 | 7/2005 | Kocon et al. |
| 6,943,408 | B2 | 9/2005 | Wu et al. |
| 2006/0226439 | A1* | 10/2006 | Robb et al. ............. 257/119 |

OTHER PUBLICATIONS

"Trench Power MOSFET Having Low Gate Charge", Published at http://ip.com/pubView/IPCOM000021950D on Feb. 17, 2004.

* cited by examiner

*Primary Examiner*—Thanhha Pham
(74) *Attorney, Agent, or Firm*—Robert F. Hightower

(57) ABSTRACT

In one embodiment, a transistor is formed to have a first current flow path to selectively conduct current in both directions through the transistor and to have a second current flow path to selectively conduct current in one direction.

5 Claims, 5 Drawing Sheets

BI-DIRECTIONAL TRANSISTOR WITH BY-PASS PATH AND METHOD THEREFOR

This application is related to an application Ser. No. 11/367,627 entitled "METHOD OF FORMING AN MOS TRANSISTOR AND STRUCTURE THEREFOR" that is filed concurrently herewith having at least one common inventor, a common assignee, and an. This application is also related to an application entitled "BI-DIRECTIONAL TRANSISTOR AND METHOD THEREFOR" filed on Mar. 31, 2005, having an application Ser. No. of 11/093,381, having at least one common inventor, and a common assignee.

BACKGROUND OF THE INVENTION

The present invention relates, in general, to electronics, and more particularly, to methods of forming semiconductor devices and structure.

In the past, portable electronic systems often were powered by multiple power sources such as one of two batteries or from a battery and an AC wall outlet via an ac/dc converter or battery charger. A network of switches generally was used to control the flow of power depending on the mode of operation. For instance, if the portable device was powered from a primary battery while a secondary battery was charged, some switches were closed while other switches were open. In another mode, the switches may have been reversed. To be effective in all modes, the switches should have conducted and blocked in both directions. However, power metal oxide semiconductor field effect transistors (power MOSFETs) could only block voltage in one direction. In the reverse direction the body diode of the MOSFET conducted current, thus, two power MOSFETs typically were connected in series to function as one switch. The two power MOSFETS typically were used with their drains tied together so that when the gate voltage was zero, one of the devices would always block the voltage applied across the two transistors regardless of the polarity. One example of such a switch was the NTLTD7900 offered by ON Semiconductor of Phoenix Ariz. Because such switches used two transistors, the switches used twice as much silicon as one transistor which increased the costs. Additionally, the on-resistance was high because the two transistors were in series. In some applications, it was desirable to have an additional current flow path.

Accordingly, it is desirable to have a method of forming a bi-directional switch that reduces costs, that reduces the resistance of the bi-directional switch, and that has more than one current flow path.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

This application is related to an application entitled "BI-DIRECTIONAL TRANSISTOR AND METHOD THEREFOR" having a filing date of Mar. 31, 2005, having at least one common inventor, a common assignee, and an application Ser. No. of 11/093,381 which is hereby incorporated herein by reference.

DETAILED DESCRIPTION OF THE DRAWINGS

Figure 1:
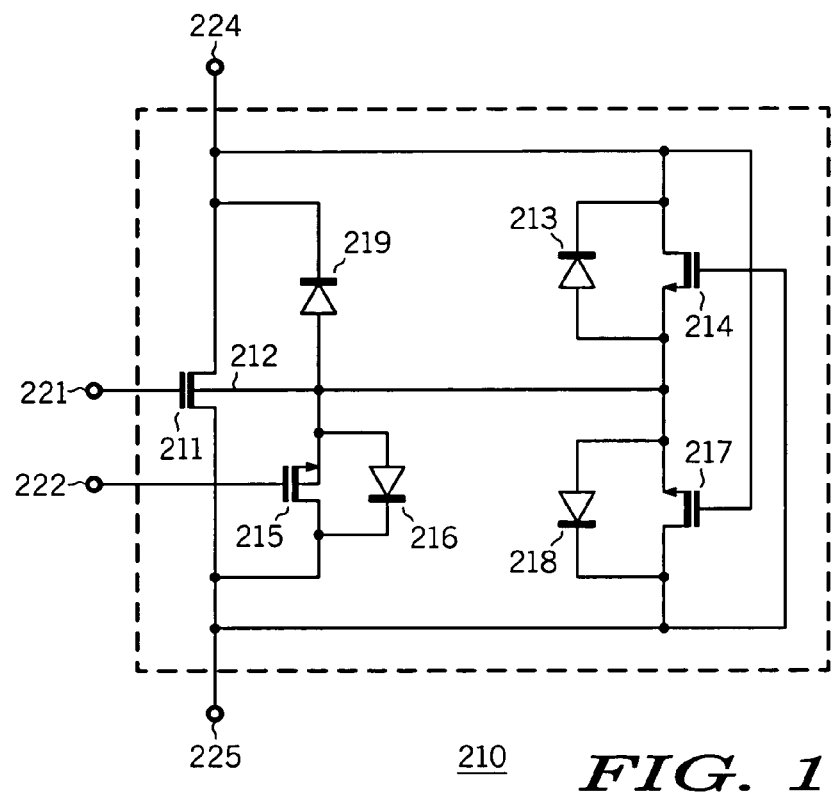
FIG. 1 schematically illustrates a circuit representation of a portion of an embodiment of a bi-directional transistor in accordance with the present invention.

FIG. 1 schematically illustrates a circuit representation of a bi-directional transistor 210 that can conduct current in both directions through transistor 210, block reverse voltages in both directions across transistor 210, and also selectively conduct current through transistor 210. Transistor 210 includes a first MOS transistor 211, a first switch or first switch transistor 214, a second switch or second switch transistor 217, and a by-pass switch or by-pass transistor 215. A parasitic source-drain diode of transistor 214 is illustrated by a diode 213, a parasitic source-drain diode of transistor 215 is illustrated by a diode 216, and a parasitic source-drain diode of transistor 217 is illustrated by a diode 218. Transistor 210 also includes a first control electrode or gate 221, a second control electrode or gate electrode 222, and current carrying electrodes 224 and 225 that can function as the source and drain of transistor 210 as will be seen further hereinafter. Although transistors 210, 211, 214, 215, and 217 are illustrated and described herein as N-channel transistors, transistor 210 and transistors 211, 214, 215, and 217 may also be implemented as P-channel transistors. As will be seen further hereinafter, transistor 211 includes a body region or body 212 that is isolated from both current carrying electrodes of transistor 211. In order to facilitate the bi-directional current conduction through transistor 210, body 212 of transistor 211 is not directly connected to either current carrying electrode of transistor 211 but is selectively coupled to either of current carrying electrodes 224 and 225 by transistors 214 and 217 responsively to the signals that are applied on the first current carrying electrode and the second current carrying electrode of transistor 210. Also, transistor 215 may be selectively enabled to conduct current between electrodes 224 and 225.

The source of a transistor typically is the electrode connected to the body of the transistor. Because body 212 is not directly connected to either the source or the drain of transistor 211, it is not clear in the circuit schematic representation of transistor 210 which current carrying electrode of transistor 210 is identified as the source or the drain of transistor 210.

In operation, if the voltage of the signals applied to current carrying electrodes 224 and 225 are such that the highest voltage is applied to electrode 225 and the lower voltage is applied to electrode 224, then electrode 224 functions as the source and electrode 225 functions as the drain of transistors 210 and 211. For such a configuration, transistor 215 may be enabled to provide a current path from electrode 224 through diode 219 and transistor 215 to electrode 225. If the voltage applied to gate electrode 222 relative to the voltage applied to electrode 224 is greater than the threshold voltages of transistor 215 and diode 219, transistor 215 is enabled to conduct current through transistor 215 and diode 219 to electrode 225. Because transistor 215 is enabled, transistors 211 and 215 do not have to block voltages applied between electrodes 224 and 225. Additionally, transistors 214 and 217 are disabled.

If the voltage applied to gate electrode 222 is less than the threshold voltage of transistor 215 plus diode 219, transistor 215 is disabled and preferably has a breakdown voltage that can sustain the voltages applied between electrodes 224 and 225. If transistor 215 is disabled and if the voltage applied to gate 221 is less than the threshold voltage of transistor 211 relative to the voltage applied to electrode 224, then transistor 211 is off or disabled. The gate of transistor 217 receives the low voltage from electrode 224, thus transistor 217 is off. The gate of transistor 214 receives the high voltage from electrode 225 which enables transistor 214 to connect body 212 to electrode 224 and to the lowest voltage applied to transistor 210. This connection facilitates transistor 210 withstanding the voltage applied between electrodes 224 and 225. If the voltage applied to gate 221 is greater than the threshold voltage of transistor 211, transistor 211 is on or enabled and current flow is enabled from electrode 225 through transistor 211 to electrode 224. Because transistor 211 is enabled, the voltage on electrode 225 is substantially the same as the voltage applied to electrode 224 (minus the Vds-on of transistor 211). Consequently, the voltage applied to the gate of transistors 214 and 217 is also low and both of transistors 214 and 217 are off. Body 212 is floating but, due to diode 213, will never be more than about 0.6 V greater than the voltage on electrode 224. Since transistor 211 is on, transistor 211 does not have to block voltages thus the connection of body 212 is not important. Typically, transistor 215 can be enabled when transistor 211 is enabled, however, transistor 215 generally would not conduct much current. If transistor 215 is enabled and transistor 211 is disabled, it usually is possible to enable transistor 211.

For the case of the voltages applied to electrodes 224 and 225 such that the voltage of electrode 224 is greater than the voltage of electrode 225, then electrode 224 functions as the drain and electrode 225 functions as a source of transistors 210 and 211. For these voltages, transistor 215 cannot be enabled and should have a breakdown voltage that is sufficient to withstand the voltages applied between electrodes 224 and 225. If the voltage applied to gate 221 relative to the voltage applied to electrode 225 is less than the threshold voltage of transistor 211, transistor 211 is in an off state or disabled. The gate of transistor 214 is at a low voltage, thus, transistor 214 is also disabled. The gate of transistor 217 is at the voltage that is applied to electrode 224. Assuming that the voltage applied to electrode 224 is greater than the threshold of transistor 217, transistor 217 is enabled and couples body 212 to current carrying electrode 225 thereby ensuring that body 212 is connected to the lowest voltage that is applied to transistor 210. This facilitates transistor 210 withstanding the voltage applied between electrodes 224 and 225. For the case of the voltage applied to gate 221 being greater than the threshold voltage of transistor 211, transistor 211 is on or enabled, thus, the voltage on electrode 224 is substantially the same as the voltage applied to electrode 225 (minus the Vds-on of transistor 211). Consequently, the voltage applied to the gate of transistors 214 and 217 is also low and both of transistors 214 and 217 are off. Body 212 is floating but, due to diode 218, will never be more that about 0.6 V greater than the voltage on electrode 225. Since transistor 211 is on, current can flow from electrode 224 through transistor 211 to electrode 225. Because transistor 211 is on, transistor 211 does not have to block voltages applied between electrodes 224 and 225 thus the connection of body 212 is not important. As will be appreciated by those skilled in the art, the on-resistance of transistors 214 and 217 typically should be low in order to support a high dv/dt. The on-resistance of transistors 214 and 217 typically is less than approximately twenty-five ohms and preferably is less than about five ohms.

In order to assist in providing this functionality for transistor 210, a drain of transistor 214 is commonly connected to the gate of transistor 217 and current carrying electrode 224. A source of transistor 214 is commonly connected to body 212 and to the source of transistor 217. A drain of transistor 217 is commonly connected to the gate of transistor 214 and to current carrying electrode 225. A drain of transistor 215 is commonly connected to electrode 225 and a first current carrying electrode of transistor 211. A second current carrying electrode of transistor 211 is connected to electrode 224. A source of transistor 215 is connected to an anode of diode 219 which has a cathode connected to electrode 224.

Figure 2:
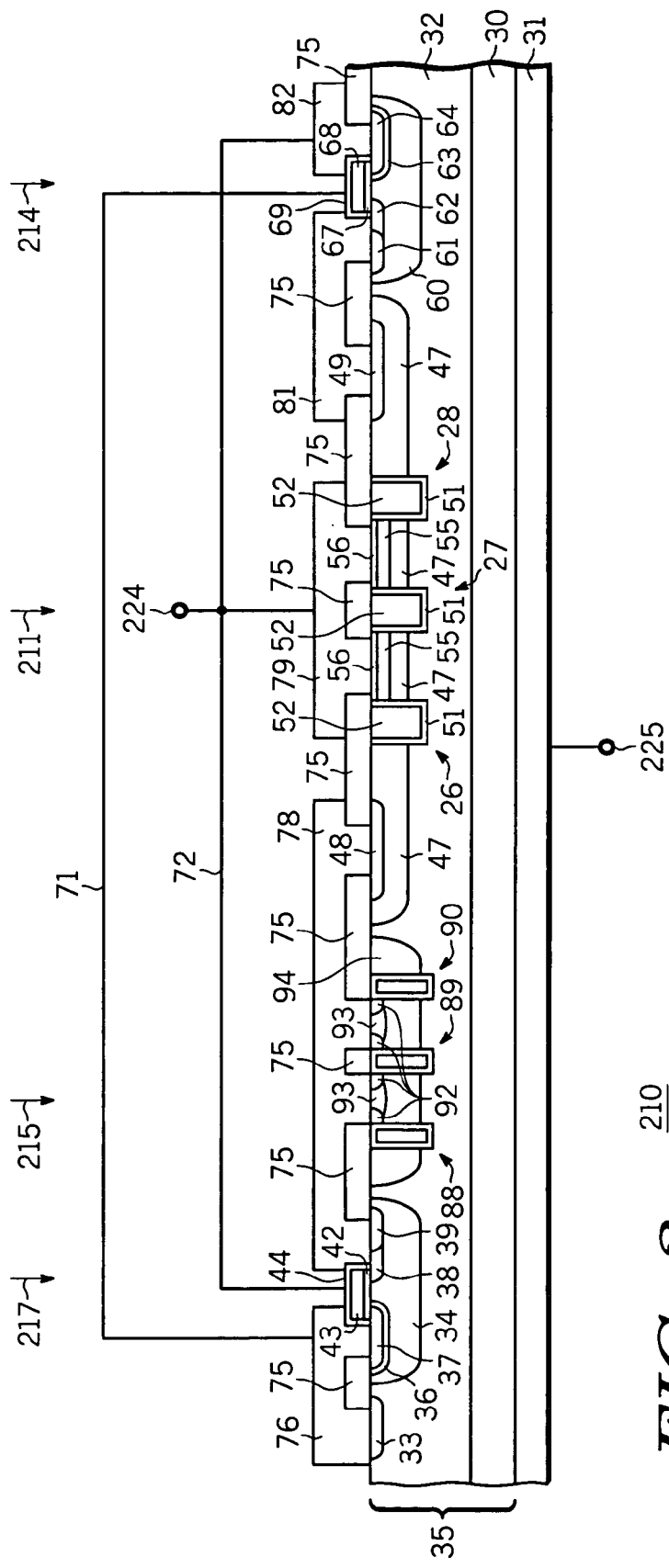
FIG. 2 illustrates a cross-sectional portion of the embodiment of the bi-directional transistor of FIG. 1 in accordance with the present invention.

FIG. 2 illustrates a cross-sectional portion of an embodiment of transistor 210 that is illustrated in FIG. 1. This description has references to both FIG. 1 and FIG. 2. In one embodiment, transistor 211 is an N-channel vertical power MOSFET that has trench gates, transistors 214 and 217 are lateral N-channel transistors, and transistor 215 is a vertical N-channel MOSFET. In this embodiment, transistor 211 has multiple trench gates that typically extend parallel to each other laterally across a semiconductor substrate 35. Transistor 215 also has multiple trench gates that typically extend parallel to each other laterally across substrate 35. Substrate 35 typically includes a bulk N-type substrate 30 and an N-type epitaxial layer 32 that is formed on a surface of bulk substrate 30. Transistors 211, 214, 215, and 217 are formed on a first surface of substrate 35. A conductor 31 is formed on a second surface of substrate 30 and functions as a portion of electrode 225 of transistor 210.

Transistor 211 includes a first doped region 47 that is formed on the first surface of substrate 35. Region 47 functions as body 212 of transistor 211 and has a conductivity type that is opposite to the conductivity type of layer 32. The doping concentration of region 47 generally is greater than the doping concentration of layer 32 in order to provide a channel region and to block voltages applied to transistor 210. Region 47 and layer 32 assist in blocking forward voltages applied to transistor 210 such as when the voltage applied to electrode 225 is greater than the voltage applied to electrode 224. Region 47 may be doped with boron at a peak concentration between about 1E16 to 1E18 atoms/cm$^3$. Region 47 often is referred to as a pHV region. A doped region 48 and a doped region 49 are formed within region 47 in order to facilitate making electrical contact to region 47. Regions 48 and 49 typically are the same conductivity as region 47 and have a higher doping concentration. Trenches are formed extending from the first surface of substrate 35 through region 47 into layer 32 in order to form trench type gates 26, 27, and 28 for transistor 211. Gates 26, 27, and 28 are identified in general by arrows. Although only three gates are illustrated, those skilled in the art will appreciate that transistor 211 may have more than three gates. An insulator 51, such as silicon dioxide, is formed along the sidewalls and bottom of each trench. The remainder of the trench is filled with a gate conductor 52, such as polysilicon, in order to form gates 26, 27, and 28. Conductor 52 typically is covered with another portion of insulator 51. A doped region 56 is formed on the surface of substrate 35 and disposed between each trench gate in order to function as a first current carrying electrode (CCE1) for transistor 211. Regions 56 are opposite in conductivity to region 47. Regions 56 may be doped with arsenic to a peak doping concentration between about 5E19 and 1E21 atoms/cm$^3$. Regions 56 typically extend from the surface of substrate 35 a first distance into region 47, typically about 0.15 microns. High voltage regions are formed to assist in blocking reverse voltages such as when the voltage applied to electrode 224 is greater than the voltage applied to electrode 225. High voltage regions, also referred to as an nHV region, are formed as doped regions 55 that extend from the surface of substrate 35 a second distance into region 47, typically about 0.5 microns, that is greater than the first distance of region 56 in order to underlie regions 56. Regions 55 may be formed before regions 56 and a portion of regions 55 may be over doped to form regions 56. Regions 55 generally have a doping concentration that is less than the doping concentration of regions 56 in order to provide a high forward breakdown voltage between region 47 and regions 55. A transistor without regions 55 would be able to sustain only a very small reverse voltage, typically less than about eight volts (8 V). However, because of regions 55 transistor 210 can sustain a large reverse voltage. Regions 55 may have a peak doping concentration of about 1E16 to 1E18 atoms/cm$^3$ to facilitate transistor 210 sustaining a reverse breakdown voltage of at least about ten to fifty volts (10-50 V). The reverse breakdown voltage can be increased by changing other parameters of transistor 210 such as the thickness of the gate insulator or the depth of the gates of transistor 211. The P-N junction formed at the interface between regions 55 and 47 forms a diode that is illustrated as diode 219 in FIG. 1. Those skilled in the art will appreciate that the interface between region 47 and layer 32 forms a diode (not shown) that is in parallel with transistor 215.

Transistor 215 generally is formed on the surface of substrate 35 and adjacent to one side of transistor 211. Transistor 215 is preferably formed as a vertical transistor because a vertical transistor has a lower on-resistance and can be more easily interconnected to transistor 211. Those skilled in the art will appreciate that the placement of transistor 215 is only illustrative and that transistor 215 may be place differently relative to the placement of transistor 211. In the preferred embodiment, a doped region 94 functions as the body of transistor 215. Region 94 is formed on the surface of substrate 35 substantially the same as region 47 but is spaced apart from region 47. Trench gates 88, 89, and 90 of transistor 215 are formed in a manner similar to gates 26, 27, and 28 of transistor 211. A trench is formed through region 94 and is lined with an insulator similar to insulator 51. A gate conductor similar to conductor 52 is formed within the trench and surrounded by insulator 51. Doped regions 93 are formed between gates 88 and 89 and between gates 89 and 90 to extend from the first surface of substrate 35 into region 94 to facilitate making electrical contact to the body of transistor 215. Region 93 typically has the same conductivity as region 94 but a higher doping concentration. Doped regions 92 are formed between gates 88 and 89 and between gates 89 and 90 to function as the source of transistor 215. Regions 92 generally are formed abutting an adjacent gate and extend to abut an adjacent region 93. Regions 92 usually are doped opposite in conductivity to region 94 and may have a doping concentration of approximately 5E19 to 5E20 atoms/cm$^3$. A conductor 78 may be used to electrically contact regions 92 and region 93. A conductor typically extends across substrate 35 to make electrical contact to the conductor of gates 88-90 as illustrated by gate electrode 222 in FIG. 1.

Transistor 217 is formed on the surface of substrate 35 and adjacent one side of transistor 215. Those skilled in the art will appreciate that the placement of transistor 215 is only illustrative and that transistor 215 may be place differently relative to the placement of transistors 211 and 215. In the preferred embodiment, transistor 217 includes a doped region 34 that functions as the body of transistor 217. Region 34 may also extend across the first surface of substrate 35 parallel to region 47 in order to facilitate forming electrical connections to region 34. Region 34 typically has a conductivity that is opposite to layer 32. A doped region 36 is formed within region 34 and has an opposite conductivity type in order to function as the drain of transistor 217. A doped region 37 is formed within region 36 and has the same conductivity at a higher doping concentration than region 36 in order to facilitate forming electrical contact to region 36. A doped region 38 having a conductivity type and doping concentration similar to region 37 is formed within region 34 and spaced apart from region 36 in order to function as the source of transistor 217. A doped region 39 which has the same conductivity type as region 34 is formed abutting region 38 to assist in forming electrical contact to region 34. The gate of transistor 217 includes a gate insulator 42 that is formed on the surface of substrate 35 and overlying a portion of at least regions 36 and 38, a gate conductor 43 that is formed overlying insulator 42, and a dielectric 44 that covers conductor 43 to insulate conductor 43 from other conductors. A doped region 33 may be formed on the surface of substrate 35 adjacent to region 34 and typically extending parallel to region 34. Region 33 has a conductivity type that is the same as layer 32 and a higher doping concentration and extends into layer 32 in order to form electrical contact to layer 32. Region 33 facilitates forming electrical contact between the drain of transistor 217 and current carrying electrode 225 of transistor 210. Those skilled in the art will appreciate that transistor 217 may also be formed as a vertical transistor especially since the drain of transistor 217 is connected to electrode 225.

Transistor 214 generally includes a doped region 60 that is similar to doped region 34 except that doped region 60 extends parallel to a different side of transistor 211 than transistors 215 and 217. Those skilled in the art will appreciate that the placement of transistor 214 is only illustrative and that transistor 214 may be placed differently relative to the placement of transistors 211, 215, and 217. A doped region 63 is formed to extend from the first surface of substrate 35 into region 60 similarly to region 36 and forms the drain of transistor 214. A doped region 64 is formed within region 63 similarly to region 37 to facilitate forming electrical contact to region 63. A doped region 62, that is similar to doped region 38, is formed within region 60 and spaced apart from region 63 to function as the source of transistor 214. A doped region 61, that is similar to region 39, is formed abutting region 62 and facilitates forming low resistance electrical contact to region 60. The doping type and concentration of regions 61, 62, 63, and 64 are similar to respective regions 39, 38, 36, and 37.

A conductor 76 usually is formed to make electrical contact to region 33 and to the drain of transistor 217 through an electrical contact to region 37. A portion of a dielectric 75, such as an inter-layer dielectric, insulates conductor 76 from portions of the first surface of substrate 35. Conductor 76 connects the drain of transistor 217 to electrode 225 of transistor 211. Conductor 78 may be formed to make electrical contact to region 47 through region 48 and to region 38 in order to connect body 212 to the source of transistor 217 and to the source of transistor 215. Another portion of dielectric 75 insulates conductor 78 from portions of the surface of substrate 35. A conductor 79 is formed to extend to overlie and make electrical contact to all regions 56 in order to form electrode 224 of transistor 211. Other portions of dielectric 75 insulate conductor 79 from gates 26, 27, and 28. A conductor 81 is formed to make electrical contact to region 49 and regions 61 and 62 in order to form an electrical contact between body 212 and the source of transistor 214. Another portion of dielectric 75 insulates conductor 81 from other portions of transistors 211 and 214. A conductor 82 is formed to make electrical contact to region 64 in order to form an electrical connection to the source of transistor 214. A portion of conductor 82 may extend across substrate 35 as a conductor 72 in order to electrically connect conductor 82 to conductor 79, thus to electrode 224 and the first current carrying electrode (CCE1) of transistor 211, and to the gate of transistor 217. Additionally, a portion of conductor 76 may extend across substrate 35 to form a conductor 71 in order to connect the drain of transistor 217 to the gate of transistor 214.

Those skilled in the art will appreciate that transistor 210 could also include a buried layer that is formed in substrate 35 and underlies gates 26-28. Such a buried layer would generally be a doped region of a conductivity type that is the same as layer 32 and at a higher doping concentration. Additionally, regions 34 and 60 may be formed as a retrograde doped region. For example, a portion of layer 32 abutting and underlying regions 34 and 60 could be doped to the same doping type as regions 34 and 60 but at a higher doping concentration than regions 34 and 60.

Figure 3:
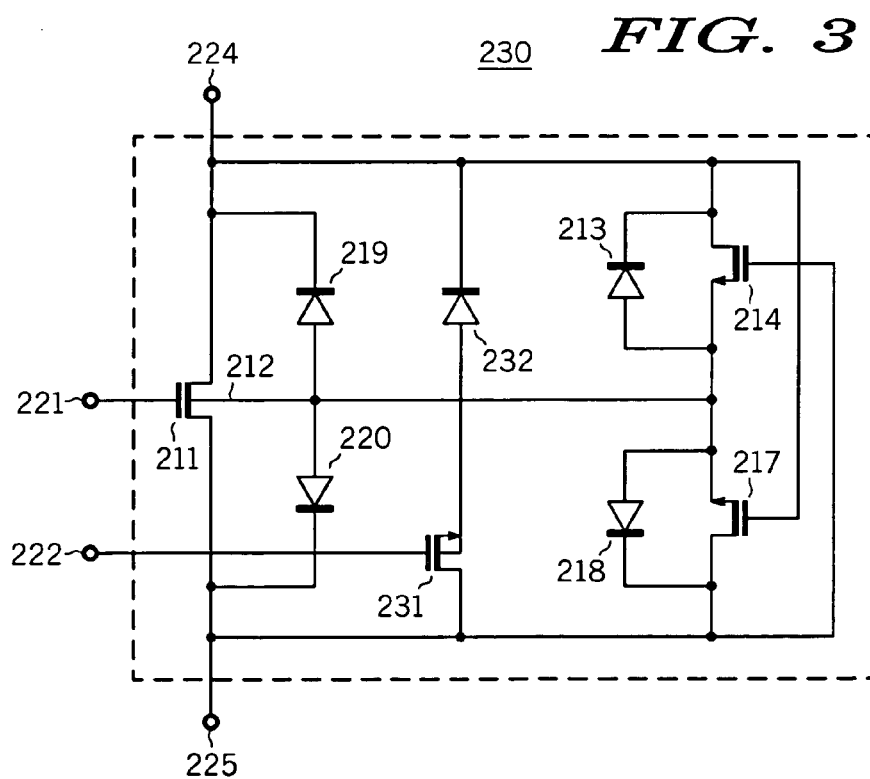
FIG. 3 schematically illustrates a circuit representation of a portion of an alternate embodiment of the bi-directional transistor of FIG. 1 in accordance with the present invention.

FIG. 3 schematically illustrates a circuit representation of a bi-directional transistor 230 that is an alternate embodiment of transistor 210 described in the description of FIG. 1 and FIG. 2.

Figure 4:
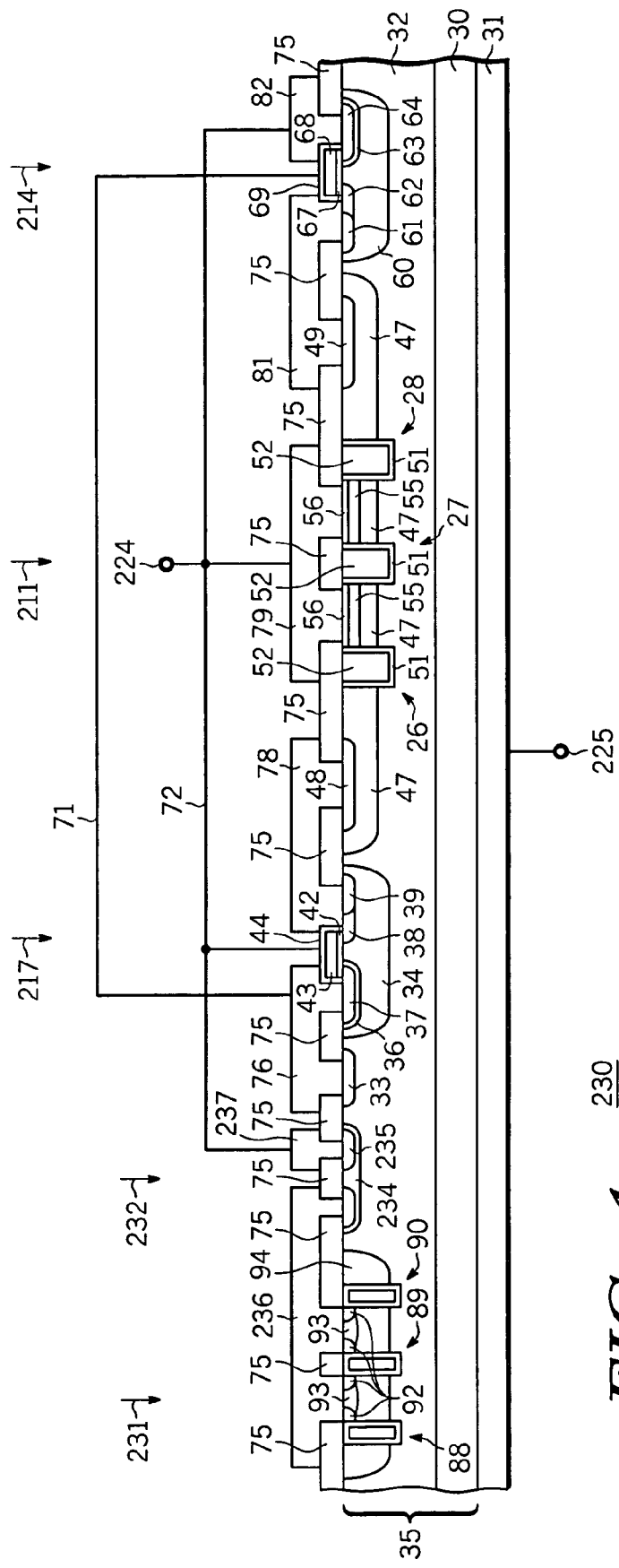
FIG. 4 illustrates a cross-sectional portion of the embodiment of the bi-directional transistor of FIG. 3 in accordance with the present invention.

FIG. 4 illustrates a cross-sectional portion of an embodiment of transistor 230. This description has references to FIG. 4 and FIG. 5. Transistor 230 is similar to transistor 210 with transistor 215 replaced by a diode 232 and another vertical MOS transistor 231 that is similar to transistor 215. Although transistor 230 is constructed similarly to transistor 215, transistor 230 is connected differently and may be positioned on substrate 35 differently that transistor 215. If the signal applied to gate electrode 222 is greater than the threshold voltages of transistor 231 plus diode 232, transistor 231 is enabled and current flows from electrode 224 through diode 232 and transistor 231 to electrode 225. To facilitate this operation of transistor 230, a drain of transistor 231 is connected to electrode 225, a gate is connected to gate electrode 222, and a source is connected to the anode of diode 232. A cathode of diode 232 is connected to electrode 224.

As illustrated in FIG. 4, transistor 231 is a vertical MOS transistor that is formed on the first surface of substrate 35. Transistor 231 typically is not adjacent to transistor 211 and diode 232 may be positioned between transistor 231 and transistor 217. Those skilled in the art will appreciate that the placement of transistor 231 is only illustrative and that transistor 231 may be placed differently relative to the placement of transistor 211 and diode 232. A doped region 234 is formed on the first surface of substrate 35 to form the anode of diode 232 and a doped region 235 is formed within region 234 to form the cathode of diode 232. Regions 234 and 235 generally are doped P-type and N-type, respectively. A conductor 236 is formed on regions 92 and 93 and on region 234 in order to form a connection between the source of transistor 231 and the anode of diode 232. A doped region within region 234 forms a low resistance contact region for connection between conductor 236 and region 234. A conductor 237 is formed to contact region 235. Conductor 237 generally is extended across the surface of substrate 35 (as illustrated by a line connecting electrode 224 to diode 232) in order to form a connection between the cathode of diode 232 and electrode 224.

Figure 5:
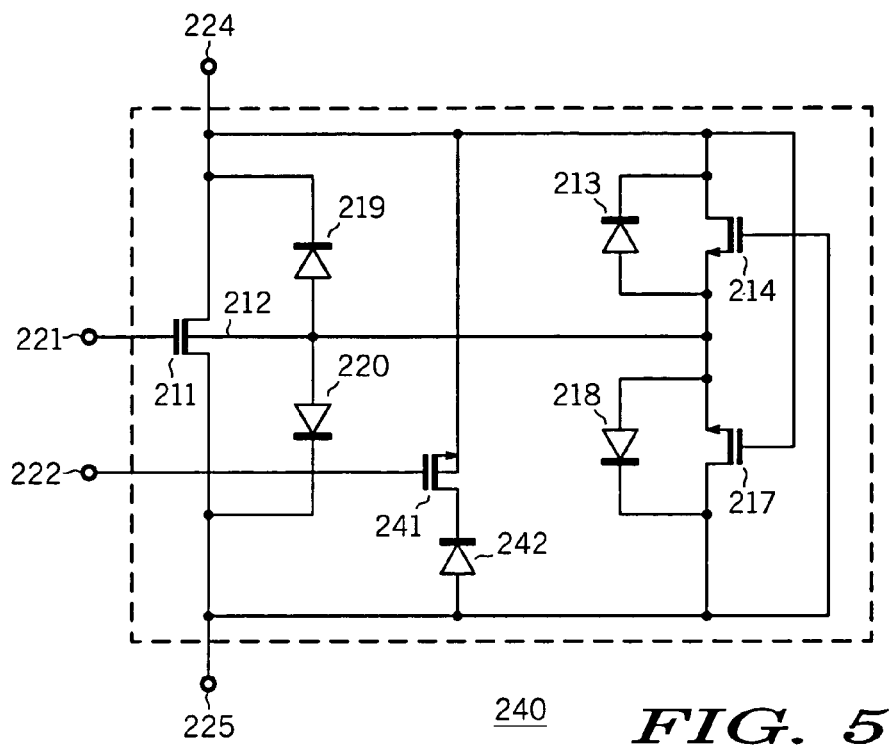
FIG. 5 schematically illustrates a circuit representation of a portion of another alternate embodiment of the bi-directional transistor of FIG. 1 in accordance with the present invention.

FIG. 5 schematically illustrates a circuit representation of a bi-directional transistor 240 that is an alternate embodiment of transistor 210 described in the description of FIG. 1 and FIG. 2.

Figure 6:
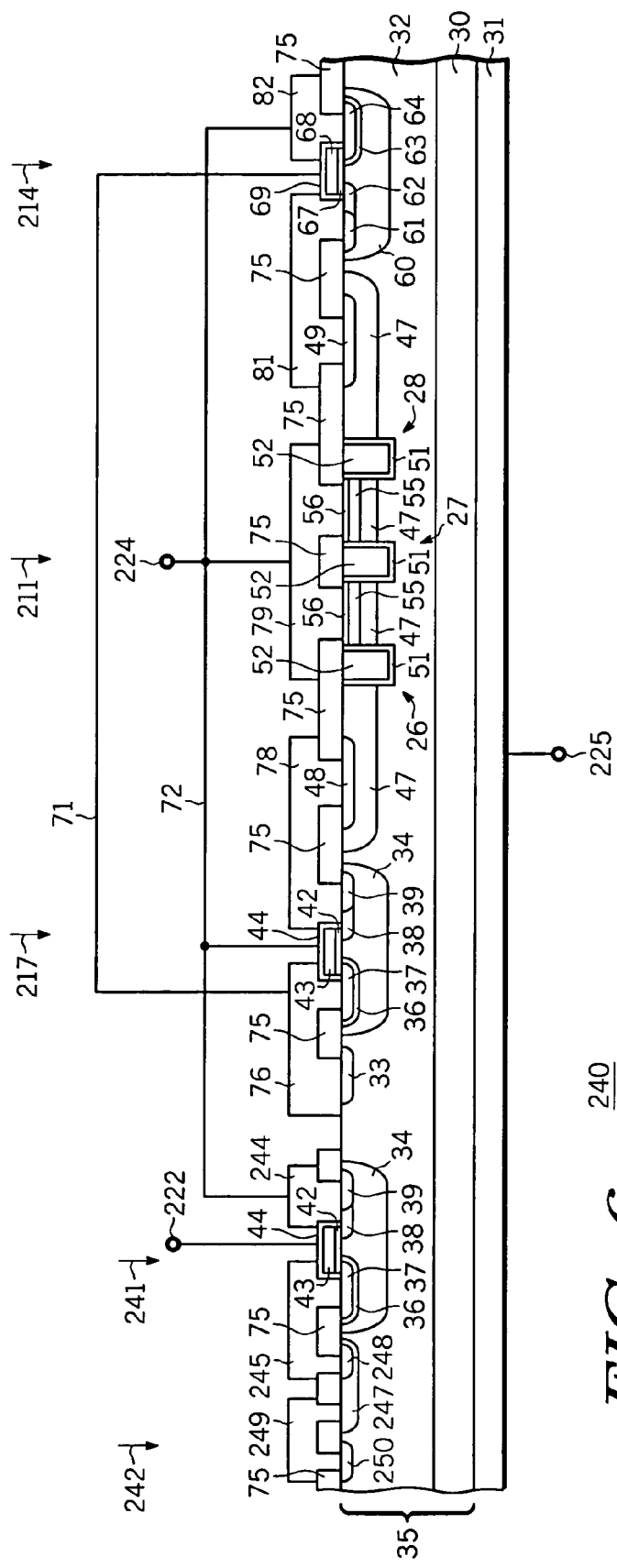
FIG. 6 illustrates a cross-sectional portion of an embodiment of the bi-directional transistor of FIG. 5 in accordance with the present invention.

FIG. 6 illustrates a cross-sectional portion of an embodiment of transistor 240. This description has references to FIG. 5 and FIG. 6. Transistor 240 is similar to transistor 210 with transistor 215 replaced by a diode 242 and a lateral MOS transistor 241. Transistor 241 is similar to transistors 214 or 217 but is connected differently and generally is positioned differently on substrate 35. If the signal applied to gate electrode 222 is greater than the threshold voltages of transistor 241 plus diode 242, transistor 241 is enabled and current flows from electrode 224 through transistor 241 and diode 242 to electrode 225. To facilitate this operation of transistor 240, a source of transistor 241 is connected to electrode 224, a gate is connected to electrode 222, and a drain is connected to the cathode of diode 242. The anode of diode 242 is connected to electrode 225.

As illustrated in FIG. 6, transistor 241 is a lateral MOS transistor that is formed on the first surface of substrate 35. Transistor 241 typically is not adjacent to transistor 211 and either of transistors 214 or 217 may be positioned between transistor 211 and transistor 241. Those skilled in the art will appreciate that the placement of transistor 241 and diode 242 is only illustrative and that transistor 241 or diode 242 may be place differently relative to the placement of transistor 211. A doped region 247 is formed on the first surface of substrate 35 to form the anode of diode 242 and a doped region 248 is formed within region 247 to form the cathode of diode 242. Regions 247 and 248 generally are doped P-type and N-type, respectively. A conductor 244 is formed on region 39 of transistor 241. Conductor 244 may be extended across the surface of substrate 35 (as illustrated by a line connecting conductor 244 to electrode 224) to facilitate connecting the source of transistor 241 to electrode 224. A conductor 245 is formed to contact region 37 of transistor 241 and region 248 of diode 242 in order to form a connection between the cathode of diode 242 and the drain of transistor 241. Region 247 is connected to layer 32 through a conductor 249 and a contact region 250 to forms a connection from the anode of diode 242 to electrode 225.

Figure 7:
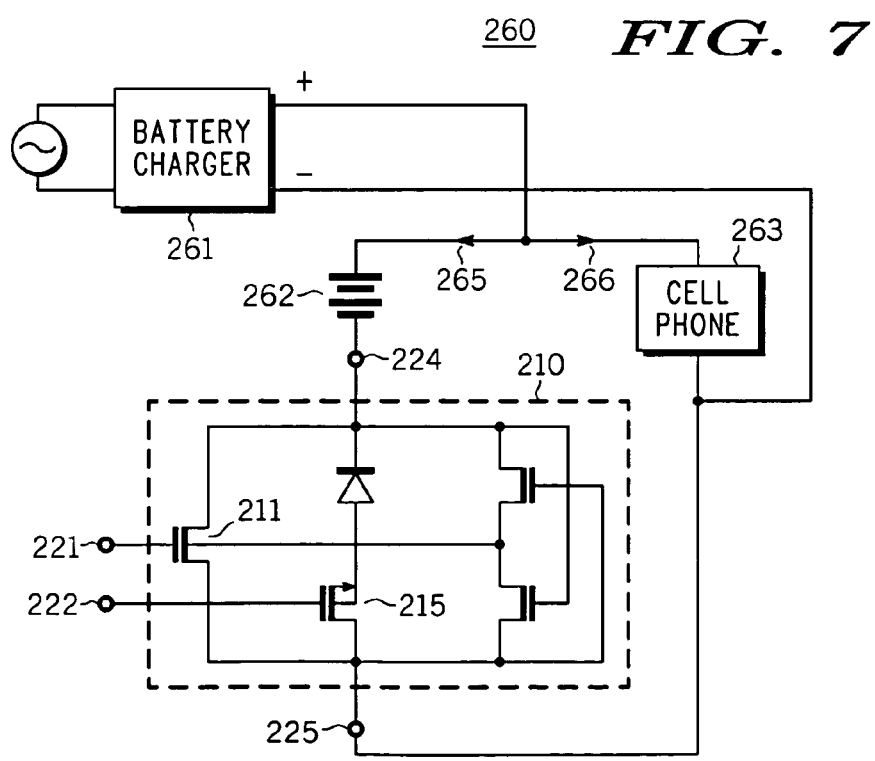
FIG. 7 schematically illustrates a system that uses the bi-directional transistor of FIG. 1 or FIG. 3 or FIG. 5 in accordance with the present invention.

FIG. 7 schematically illustrates a system 260 that uses bi-directional transistor 210. System 260 represents a cellular telephone charging system that includes a cellular telephone or cell phone 263, a battery 262 that generally is a part of phone 263, and a battery charger 261. Charger 261 receives power from a mains circuit and provides a charger current 265 to charge battery 262 and an operating current 266 to operate phone 263. In some cases, it is desirable to disable current 265 while still providing current 266. For example, if battery 262 is fully charged, it is desirable to prevent further charging of battery 262 and allow phone 263 to operate from charger 261 and current 266. In this case, transistor 211 is disabled to prevent current 265 from flowing through battery 262. However, transistor 215 is enabled to provide a return path of current 266 without charging battery 262. Enabling transistor 215 allows current 266 to flow from charger 261 through phone 263, through transistor 215, and through battery 262 back to charger 261 without charging or discharging battery 262.

In view of all of the above, it is evident that a novel device and method is disclosed. Included, among other features, is forming a by-pass current flow path through a bi-directional transistor wherein the by-pass current flow path selectively allows current to flow in one direction. The bi-directional transistor is also formed to selectively couple body 212 to different electrodes of transistor 210 in order to facilitate bi-directional blocking of voltages applied to transistor 210. Forming the nHV region underlying the region 56 facilitates sustaining voltages across transistor 210. Using one transistor instead of two series connected transistors reduces the cost of the bi-directional transistor and systems that use the bi-directional transistor. Forming either of transistors 215, 231, or 241 in a parallel path with transistor 211 provides a selectively enabled current flow path in one direction with the current flow path of transistor 211.

While the invention is described with specific preferred embodiments, it is evident that many alternatives and variations will be apparent to those skilled in the semiconductor arts. More specifically the invention has been described for a particular N-channel MOS transistor structure, although the method is directly applicable to P-channel transistors as well as to BiCMOS, metal semiconductor FETs (MESFETs), HFETs, and other transistor structures. Those skilled in the art will realize that other metal layers may be used to assist in forming more electrical contacts to the body regions in order to reduce resistance. Those skilled in the art will also appreciate that the placement of the transistors relative to each other is only illustrative and that the transistors may be place differently relative to the placement of other transistors of the bi-directional transistor. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming a bi-directional transistor comprising:
    forming a first MOS transistor on a semiconductor substrate of a first conductivity type, the first MOS transistor having a first current carrying electrode and a second current carrying electrode;
    forming a body region of the first MOS transistor on a surface of the semiconductor substrate and isolated from a first current carrying electrode region of the first MOS transistor by a first P-N junction and isolated from a second current carrying electrode region of the first MOS transistor by a second P-N junction;
    forming a second MOS transistor configured to selectively couple the body region of the first MOS transistor to the first current carrying electrode of the first MOS transistor; and
    forming a third MOS transistor on a surface of the semiconductor substrate and coupled to form a current flow path in parallel with the first MOS transistor.

2. The method of claim 1 further including forming the second MOS transistor electrically coupled between the body region of the first MOS transistor and the second current carrying electrode region of the first MOS transistor.

3. The method of claim 1 wherein the first MOS transistor is a vertical transistor and the second MOS transistor is a lateral MOS transistor formed on the semiconductor substrate.

4. The method of claim 1 further including a fourth MOS transistor configured to selectively couple the body region of the first MOS transistor to the second current carrying electrode of the first MOS transistor.

5. A method of forming a bi-directional transistor comprising:
    forming a first MOS transistor on a semiconductor substrate of a first conductivity type, the first MOS transistor having a first current carrying electrode and a second current carrying electrode;
    forming a body region of the first MOS transistor on a surface of the semiconductor substrate and isolated from a first current carrying electrode region of the first MOS transistor by a first P-N junction and isolated from a second current carrying electrode region of the first MOS transistor by a second P-N junction;
    forming a third P-N junction on the surface of the semiconductor substrate and spaced apart from the first P-N junction wherein the third P-N junction is not a portion of the first transistor, the third P-N junction having a first electrode and a second electrode wherein the first electrode is coupled to the first current carrying electrode of the first transistor; and
    forming a fourth P-N junction on the surface of the semiconductor substrate and spaced apart from the first P-N junction and the third P-N junction wherein the fourth P-N junction is not a portion of the first transistor, the fourth P-N junction having a first electrode and a second electrode wherein the first electrode is coupled to the second current carrying electrode of the first transistor and wherein the second electrode of the fourth P-N junction is coupled to the second electrode of the third P-N junction.

* * * * *